United States Patent
Khlat et al.

(10) Patent No.: US 10,439,557 B2
(45) Date of Patent: Oct. 8, 2019

(54) ENVELOPE TRACKING POWER MANAGEMENT CIRCUIT

(71) Applicant: Qorvo US, Inc., Greensboro, NC (US)

(72) Inventors: Nadim Khlat, Cugnaux (FR); Michael R. Kay, Summerfield, NC (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 15/984,566

(22) Filed: May 21, 2018

(65) Prior Publication Data

US 2019/0222175 A1    Jul. 18, 2019

Related U.S. Application Data

(60) Provisional application No. 62/617,389, filed on Jan. 15, 2018.

(51) Int. Cl.
| | |
|---|---|
| *H03F 1/02* | (2006.01) |
| *H03F 3/20* | (2006.01) |
| *H03F 3/189* | (2006.01) |
| *H02M 3/07* | (2006.01) |

(52) U.S. Cl.
CPC ............. *H03F 1/02* (2013.01); *H03F 3/189* (2013.01); *H03F 3/20* (2013.01); *H02M 3/07* (2013.01); *H03F 2200/102* (2013.01); *H03F 2200/451* (2013.01)

(58) Field of Classification Search
CPC ........................................................ H03F 1/02
USPC .................................................. 330/127, 297
See application file for complete search history.

(56) References Cited

U.S. PATENT DOCUMENTS

| | | |
|---|---|---|
| 5,838,732 A | 11/1998 | Carney |
| 7,043,213 B2 | 5/2006 | Robinson et al. |
| 7,471,155 B1 | 12/2008 | Levesque |
| 7,570,931 B2 | 8/2009 | McCallister et al. |
| 8,461,928 B2 | 6/2013 | Yahav et al. |
| 8,718,188 B2 | 5/2014 | Balteanu et al. |
| 8,725,218 B2 | 5/2014 | Brown et al. |
| 8,774,065 B2 | 7/2014 | Khlat et al. |

(Continued)

OTHER PUBLICATIONS

U.S. Appl. No. 15/704,131, filed Sep. 14, 2017.

(Continued)

*Primary Examiner* — Henry Choe
(74) *Attorney, Agent, or Firm* — Withrow & Terranova, P.L.L.C.

(57) ABSTRACT

An envelope tracking (ET) power management circuit is provided. The ET power management circuit includes a number of tracker circuits each configured to operate based on a respective input voltage. In various operation scenarios, one or more selected tracker circuits may be configured to provide ET modulated voltages to a number of amplifier circuits. In examples discussed herein, each of the selected tracker circuits is configured to draw the respective input voltage from a single voltage circuit (e.g., an inductor-based buck-boost circuit) in the ET power management circuit. By utilizing the single voltage circuit to power the selected tracker circuits, as opposed to employing multiple voltage circuits, it is possible to reduce the footprint of the ET power management circuit, thus helping to reduce cost and power consumption of the ET power management circuit.

21 Claims, 4 Drawing Sheets

(56) References Cited

U.S. PATENT DOCUMENTS

| | | | |
|---|---|---|---|
| 8,803,603 B2 * | 8/2014 | Wimpenny | H03F 1/0222 330/124 R |
| 8,879,665 B2 | 11/2014 | Xia et al. | |
| 8,913,690 B2 | 12/2014 | Onishi | |
| 8,989,682 B2 | 3/2015 | Ripley et al. | |
| 9,041,365 B2 | 5/2015 | Kay et al. | |
| 9,065,509 B1 | 6/2015 | Yan et al. | |
| 9,069,365 B2 | 6/2015 | Brown et al. | |
| 9,098,099 B2 | 8/2015 | Park et al. | |
| 9,166,830 B2 | 10/2015 | Camuffo et al. | |
| 9,197,182 B2 * | 11/2015 | Baxter | H03G 3/3042 |
| 9,225,362 B2 | 12/2015 | Drogi et al. | |
| 9,263,997 B2 | 2/2016 | Vinayak | |
| 9,280,163 B2 | 3/2016 | Kay et al. | |
| 9,288,098 B2 | 3/2016 | Yan et al. | |
| 9,344,304 B1 | 5/2016 | Cohen | |
| 9,356,512 B2 | 5/2016 | Chowdhury et al. | |
| 9,515,622 B2 | 12/2016 | Nentwig et al. | |
| 9,520,907 B2 | 12/2016 | Peng et al. | |
| 9,584,071 B2 | 2/2017 | Khlat | |
| 9,595,981 B2 | 3/2017 | Khlat | |
| 9,748,845 B1 | 8/2017 | Kotikalapoodi | |
| 9,806,676 B2 | 10/2017 | Balteanu et al. | |
| 9,831,834 B2 | 11/2017 | Balteanu et al. | |
| 9,923,520 B1 | 3/2018 | Abdelfattah et al. | |
| 10,158,330 B1 | 12/2018 | Khlat | |
| 2004/0266366 A1 | 12/2004 | Robinson et al. | |
| 2005/0232385 A1 | 10/2005 | Yoshikawa et al. | |
| 2009/0045872 A1 | 2/2009 | Kenington | |
| 2011/0136452 A1 | 6/2011 | Pratt et al. | |
| 2011/0279179 A1 | 11/2011 | Vice | |
| 2012/0194274 A1 | 8/2012 | Fowers et al. | |
| 2012/0200435 A1 | 8/2012 | Ngo et al. | |
| 2012/0299645 A1 * | 11/2012 | Southcombe | H03F 1/0227 330/127 |
| 2012/0299647 A1 * | 11/2012 | Honjo | H03F 1/0227 330/127 |
| 2013/0021827 A1 | 1/2013 | Ye | |
| 2013/0130724 A1 | 5/2013 | Kumar Reddy et al. | |
| 2013/0187711 A1 | 7/2013 | Goedken et al. | |
| 2013/0200865 A1 | 8/2013 | Wimpenny | |
| 2014/0009226 A1 | 1/2014 | Severson | |
| 2014/0028370 A1 | 1/2014 | Wimpenny | |
| 2014/0028390 A1 * | 1/2014 | Davis | H02J 7/0065 330/127 |
| 2014/0103995 A1 | 4/2014 | Langer | |
| 2014/0155002 A1 | 6/2014 | Dakshinamurthy et al. | |
| 2014/0210550 A1 | 7/2014 | Mathe et al. | |
| 2014/0218109 A1 | 8/2014 | Wimpenny | |
| 2014/0235185 A1 | 8/2014 | Drogi | |
| 2014/0266423 A1 | 9/2014 | Drogi et al. | |
| 2014/0266428 A1 | 9/2014 | Chiron et al. | |
| 2014/0315504 A1 | 10/2014 | Sakai et al. | |
| 2014/0361830 A1 | 12/2014 | Mathe et al. | |
| 2015/0071382 A1 | 3/2015 | Wu et al. | |
| 2015/0188432 A1 | 7/2015 | Vannorsdel et al. | |
| 2015/0236654 A1 | 8/2015 | Jiang et al. | |
| 2015/0236729 A1 | 8/2015 | Peng et al. | |
| 2015/0280652 A1 | 10/2015 | Cohen | |
| 2015/0333781 A1 | 11/2015 | Alon et al. | |
| 2016/0065137 A1 | 3/2016 | Khlat | |
| 2016/0099687 A1 | 4/2016 | Khlat | |
| 2016/0105151 A1 | 4/2016 | Langer | |
| 2016/0118941 A1 | 4/2016 | Wang | |
| 2016/0187627 A1 | 6/2016 | Abe | |
| 2016/0197627 A1 | 7/2016 | Qin et al. | |
| 2016/0294587 A1 | 10/2016 | Jiang et al. | |
| 2017/0141736 A1 | 5/2017 | Pratt et al. | |
| 2017/0317913 A1 | 11/2017 | Kim et al. | |
| 2017/0338773 A1 | 11/2017 | Balteanu et al. | |
| 2018/0048276 A1 | 2/2018 | Khlat et al. | |
| 2018/0076772 A1 | 3/2018 | Khesbak et al. | |
| 2018/0309414 A1 | 10/2018 | Khlat et al. | |
| 2018/0367101 A1 | 12/2018 | Chen et al. | |
| 2019/0068234 A1 | 2/2019 | Khlat et al. | |
| 2019/0109566 A1 | 4/2019 | Folkmann et al. | |
| 2019/0109613 A1 | 4/2019 | Khlat et al. | |

OTHER PUBLICATIONS

U.S. Appl. No. 15/728,202, filed Oct. 9, 2017.
U.S. Appl. No. 15/792,909, filed Oct. 25, 2017.
U.S. Appl. No. 15/888,260, filed Feb. 5, 2018.
U.S. Appl. No. 15/888,300, filed Feb. 5, 2018.
U.S. Appl. No. 15/902,244, filed Feb. 22, 2018.
Final Office Action for U.S. Appl. No. 15/888,300, dated Feb. 15, 2019, 15 pages.
Non-Final Office Action for U.S. Appl. No. 15/986,948, dated Mar. 28, 2019, 8 pages.
Non-Final Office Action for U.S. Appl. No. 16/018,426, dated Apr. 11, 2019, 11 pages.
Supplemental Notice of Allowability for U.S. Appl. No. 15/902,244, dated Mar. 20, 2019, 6 pages.
Notice of Allowance for U.S. Appl. No. 15/902,244, dated Feb. 8, 2019, 8 pages.
Non-Final Office Action for U.S. Appl. No. 14/836,634, dated May 16, 2016, 9 pages.
Non-Final Office Action for U.S. Appl. No. 14/868,890, dated Jul. 14, 2016, 13 pages.
Non-Final Office Action for U.S. Appl. No. 15/792,909, dated May 18, 2018, 13 pages.
Notice of Allowance for U.S. Appl. No. 15/459,449, dated Mar. 28, 2018, 7 pages.
Notice of Allowance for U.S. Appl. No. 15/723,460, dated Jul. 24, 2018, 8 pages.
Notice of Allowance for U.S. Appl. No. 15/704,131, dated Jul. 17, 2018, 7 pages.
Notice of Allowance for U.S. Appl. No. 15/728,202, dated Aug. 2, 2018, 7 pages.
Non-Final Office Action for U.S. Appl. No. 15/888,300, dated Aug. 28, 2018, 11 pages.
Pfister, Henry, "Discrete-Time Signal Processing," Lecture Note, pfister.ee.duke.edu/courses/ece485/dtsp.pdf, Mar. 3, 2017, 22 pages.
Advisory Action for U.S. Appl. No. 15/888,300, dated Jun. 5, 2019, 3 pages.
Non-Final Office Action for U.S. Appl. No. 15/888,260, dated May 2, 2019, 14 pages.
Notice of Allowance for U.S. Appl. No. 16/150,556, dated Jul. 29, 2019, 7 pages.
Non-Final Office Action for U.S. Appl. No. 15/888,300, dated Jun. 27, 2019, 17 pages.

* cited by examiner

ENVELOPE TRACKING POWER MANAGEMENT CIRCUIT

RELATED APPLICATIONS

This application claims the benefit of provisional patent application Ser. No. 62/617,389, filed Jan. 15, 2018, the disclosure of which is hereby incorporated herein by reference in its entirety.

FIELD OF THE DISCLOSURE

The technology of the disclosure relates generally to envelope tracking (ET) power amplifier circuits.

BACKGROUND

Mobile communication devices have become increasingly common in current society for providing wireless communication services. The prevalence of these mobile communication devices is driven in part by the many functions that are now enabled on such devices. Increased processing capabilities in such devices means that mobile communication devices have evolved from being pure communication tools into sophisticated mobile multimedia centers that enable enhanced user experiences.

The redefined user experience requires higher data rates offered by wireless communication technologies, such as fifth generation new radio (5G-NR) and Wi-Fi that typically operates in higher frequency spectrums. To achieve higher data rates with increased robustness in the higher frequency spectrums, the mobile communication devices may employ multiple antennas to enable multiple-input multiple-output (MIMO) and/or beamforming operations. Sophisticated power amplifiers (PAs) may be employed to increase output power of radio frequency (RF) signals (e.g., maintaining sufficient energy per bit) prior to transmitting the RF signals from the multiple antennas. However, the increased number of antennas and PAs can lead to increased power dissipation in the mobile communication devices, thus compromising overall performance and user experiences.

Envelope tracking is a power management technology designed to improve efficiency levels of the PAs to help reduce power dissipation in the mobile communication devices. As the name suggests, an envelope tracking system keeps track of an amplitude envelope of the RF signals communicated by the mobile communication devices. The envelope tracking system constantly adjusts supply voltages applied to the PAs to ensure that the PAs are operating at a higher linearity and efficiency for a given instantaneous output power requirement of the RF signals. Notably, the real estate of a mobile communication device has become increasingly precious as more and more antennas, PAs, and/or envelope tracking circuits are packed into the envelope tracking system. As such, it may be necessary to maintain or even reduce footprint of the envelope tracking system without compromising performance of mobile communication device.

SUMMARY

Embodiments of the disclosure relate to an envelope tracking (ET) power management circuit. The ET power management circuit includes a number of tracker circuits each configured to operate based on a respective input voltage. In various operation scenarios, one or more selected tracker circuits may be configured to provide ET modulated voltages to a number of amplifier circuits. In examples discussed herein, each of the selected tracker circuits is configured to draw the respective input voltage from a single voltage circuit (e.g., an inductor-based buck-boost circuit) in the ET power management circuit. By utilizing the single voltage circuit to power the selected tracker circuits, as opposed to employing multiple voltage circuits, it is possible to reduce footprint of the ET power management circuit, thus helping to reduce cost and power consumption of the ET power management circuit.

In one aspect, an ET power management circuit is provided. The ET power management circuit includes a voltage circuit, including a voltage output, configured to generate a supply voltage at the voltage output. The ET power management circuit also includes a number of tracker circuits including a number of voltage inputs configured to receive a number of input voltages. The tracker circuits are configured to generate a number of ET modulated voltages based on the input voltages, respectively. The ET power management circuit also includes control circuitry configured to couple the voltage output to at least one selected voltage inputs among the voltage inputs to provide the supply voltage to at least one selected tracker circuit among the tracker circuits as a selected input voltage among the input voltages.

Those skilled in the art will appreciate the scope of the present disclosure and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the disclosure, and together with the description serve to explain the principles of the disclosure.

DETAILED DESCRIPTION

Figure 1:
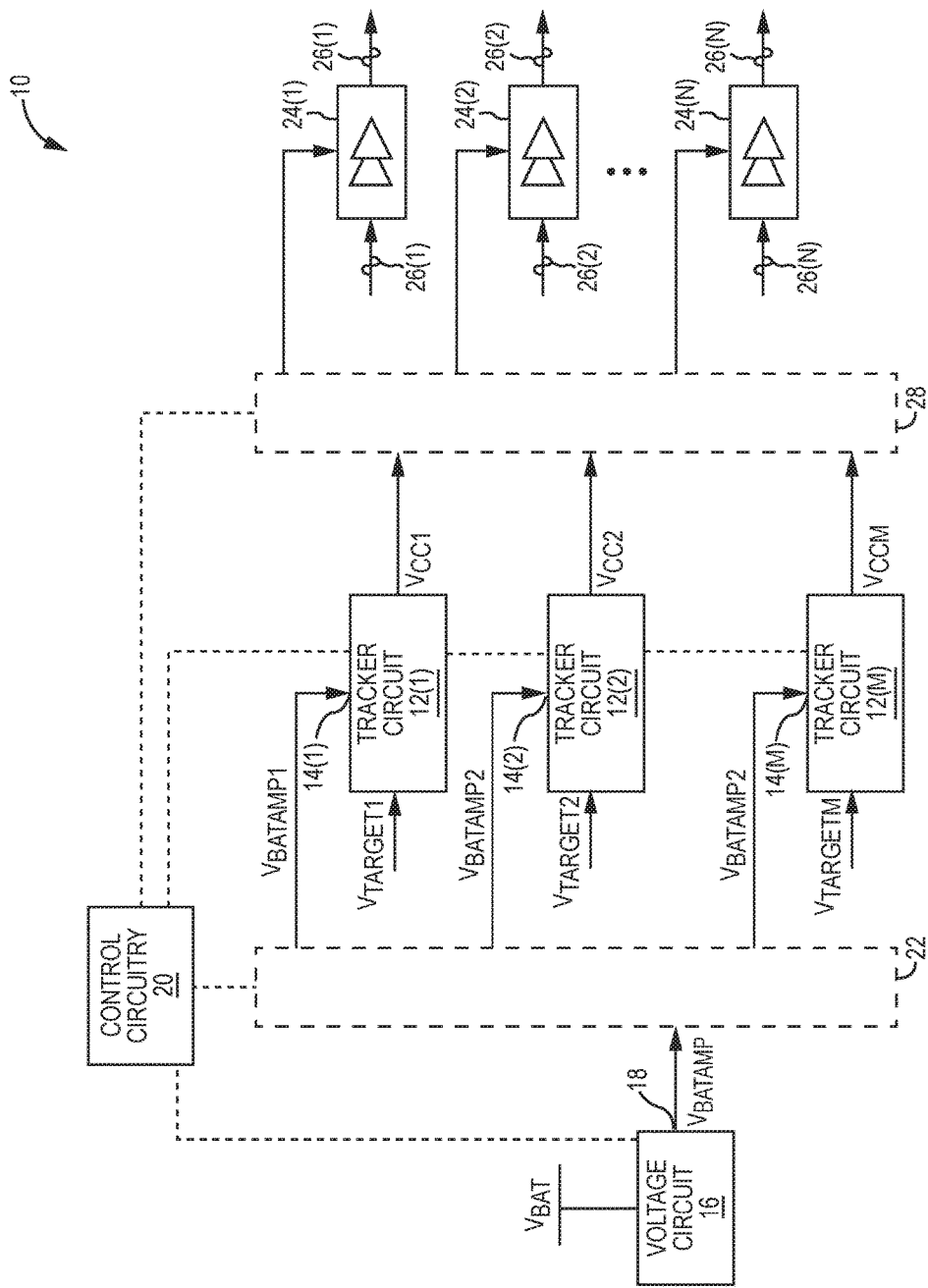
FIG. 1 is a schematic diagram of an exemplary ET power management circuit in which a number of tracker circuits are configured to provide ET modulated voltages for supporting uplink carrier aggregation (ULCA) and/or multiple-input multiple-output (MIMO) operations.

The embodiments set forth below represent the necessary information to enable those skilled in the art to practice the embodiments and illustrate the best mode of practicing the embodiments. Upon reading the following description in light of the accompanying drawing figures, those skilled in the art will understand the concepts of the disclosure and will recognize applications of these concepts not particularly addressed herein. It should be understood that these concepts and applications fall within the scope of the disclosure and the accompanying claims.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

It will be understood that when an element such as a layer, region, or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. Likewise, it will be understood that when an element such as a layer, region, or substrate is referred to as being "over" or extending "over" another element, it can be directly over or extend directly over the other element or intervening elements may also be present. In contrast, when an element is referred to as being "directly over" or extending "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The terminology used herein is for the purpose of describing particular embodiments only and is not intended to be limiting of the disclosure. As used herein, the singular forms "a," "an," and "the" are intended to include the plural forms as well, unless the context clearly indicates otherwise. It will be further understood that the terms "comprises," "comprising," "includes," and/or "including" when used herein specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this disclosure belongs. It will be further understood that terms used herein should be interpreted as having a meaning that is consistent with their meaning in the context of this specification and the relevant art and will not be interpreted in an idealized or overly formal sense unless expressly so defined herein.

Embodiments of the disclosure relate to an envelope tracking (ET) power management circuit. The ET power management circuit includes a number of tracker circuits each configured to operate based on a respective input voltage. In various operation scenarios, one or more selected tracker circuits may be configured to provide ET modulated voltages to a number of amplifier circuits. In examples discussed herein, each of the selected tracker circuits is configured to draw the respective input voltage from a single voltage circuit (e.g., an inductor-based buck-boost circuit) in the ET power management circuit. By utilizing the single voltage circuit to power the selected tracker circuits, as opposed to employing multiple voltage circuits, it is possible to reduce a footprint of the ET power management circuit, thus helping to reduce cost and power consumption of the ET power management circuit.

In this regard, FIG. 1 is a schematic diagram of an exemplary ET power management circuit 10 in which a number of tracker circuits 12(1)-12(M) are configured to provide ET modulated voltages for supporting uplink carrier aggregation (ULCA) and/or multiple-input multiple-output (MIMO) operations. The tracker circuits 12(1)-12(M) are configured to receive a number of input voltages $V_{BATAMP1}$-$V_{BATAMPM}$ via a number of voltage inputs 14(1)-14(M), respectively. Accordingly, the tracker circuits 12(1)-12(M) generate a number of ET modulated voltages $V_{CC1}$-$V_{CCM}$ based on the input voltages $V_{BATAMP1}$-$V_{BATAMPM}$, respectively. The tracker circuits 12(1)-12(M) also receive a number of target voltages $V_{TARGET1}$-$V_{TARGETM}$, each representing a time-variant voltage envelope. Accordingly, the tracker circuits 12(1)-12(M) generate the ET modulated voltages $V_{CC1}$-$V_{CCM}$ that track the time-variant envelope of the target voltages $V_{TARGET1}$-$V_{TARGETM}$, respectively.

According to a conventional design, it may require multiple voltage circuits to generate and provide the input voltages $V_{BATAMP1}$-$V_{BATAMPM}$ required by the tracker circuits 12(1)-12(M). However, employing multiple voltage circuits may significantly increase the footprint of the ET power management circuit 10 and, consequently, lead to increased cost, power consumption, and design complexity.

To overcome the shortcomings associated with employing multiple voltage circuits, the ET power management circuit 10 is configured to supply the input voltages $V_{BATAMP1}$-$V_{BATAMPM}$ based on a single voltage circuit. In examples discussed herein, the ET power management circuit 10 may dynamically adjust the voltage supplied by the single voltage circuit based on various operation scenarios. By utilizing the single voltage circuit to power the tracker circuits 12(1)-12(M), as opposed to employing the multiple voltage circuits, it is possible to reduce the footprint of the ET power management circuit 10, thus helping to reduce cost and power consumption of the ET power management circuit 10.

In this regard, the ET power management circuit 10 includes a voltage circuit 16 that is configured to generate a supply voltage $V_{BATAMP}$ at a voltage output 18. In a non-limiting example, the voltage circuit 16 derives the supply voltage $V_{BATAMP}$, which can be a constant voltage, from a battery voltage $V_{BAT}$. The voltage circuit 16 may be an inductor-based buck-boost circuit or a capacitor-based buck-boost circuit.

The ET power management circuit 10 includes control circuitry 20, which can be provided as a microprocessor, a microcontroller, or a field-programmable gate array (FPGA), for example. The control circuitry 20 can be configured to couple the voltage output 18 to at least one selected voltage input among the voltage inputs 14(1)-14(M) to provide the supply voltage $V_{BATAMP}$ to at least one selected tracker circuit among the tracker circuits 12(1)-12(M) as a selected input voltage among the input voltages $V_{BATAMP1}$-$V_{BATAMPM}$.

In a non-limiting example, the control circuitry 20 can couple the voltage output 18 to the selected voltage input via input voltage switching circuitry 22. The input voltage switching circuitry 22 may be constructed based on any number, type, and/or layout of switches to selectively couple the voltage output 18 to the selected voltage input of the selected tracker circuit.

The ET power management circuit 10 includes a number of amplifier circuits 24(1)-24(N) configured to amplify a number of RF signals 26(1)-26(N), respectively, based on a selected number of the ET modulated voltages $V_{CC1}$-$V_{CCM}$ generated by the tracker circuits 12(1)-12(M). Notably, when the ET power management circuit 10 is supporting the ULCA operation, the RF signals 26(1)-26(N) may be different signals. In contrast, when the ET power management circuit 10 is supporting the MIMO operation, the RF signals 26(1)-26(N) may be identical signals.

The ET power management circuit 10 may include output voltage switching circuitry 28. The output voltage switching circuitry 28 may be constructed based on any number, type, and/or layout of switches to selectively provide the selected number of the ET modulated voltages $V_{CC1}$-$V_{CCM}$ to one or more of the amplifier circuits 24(1)-24(N).

Figure 2:
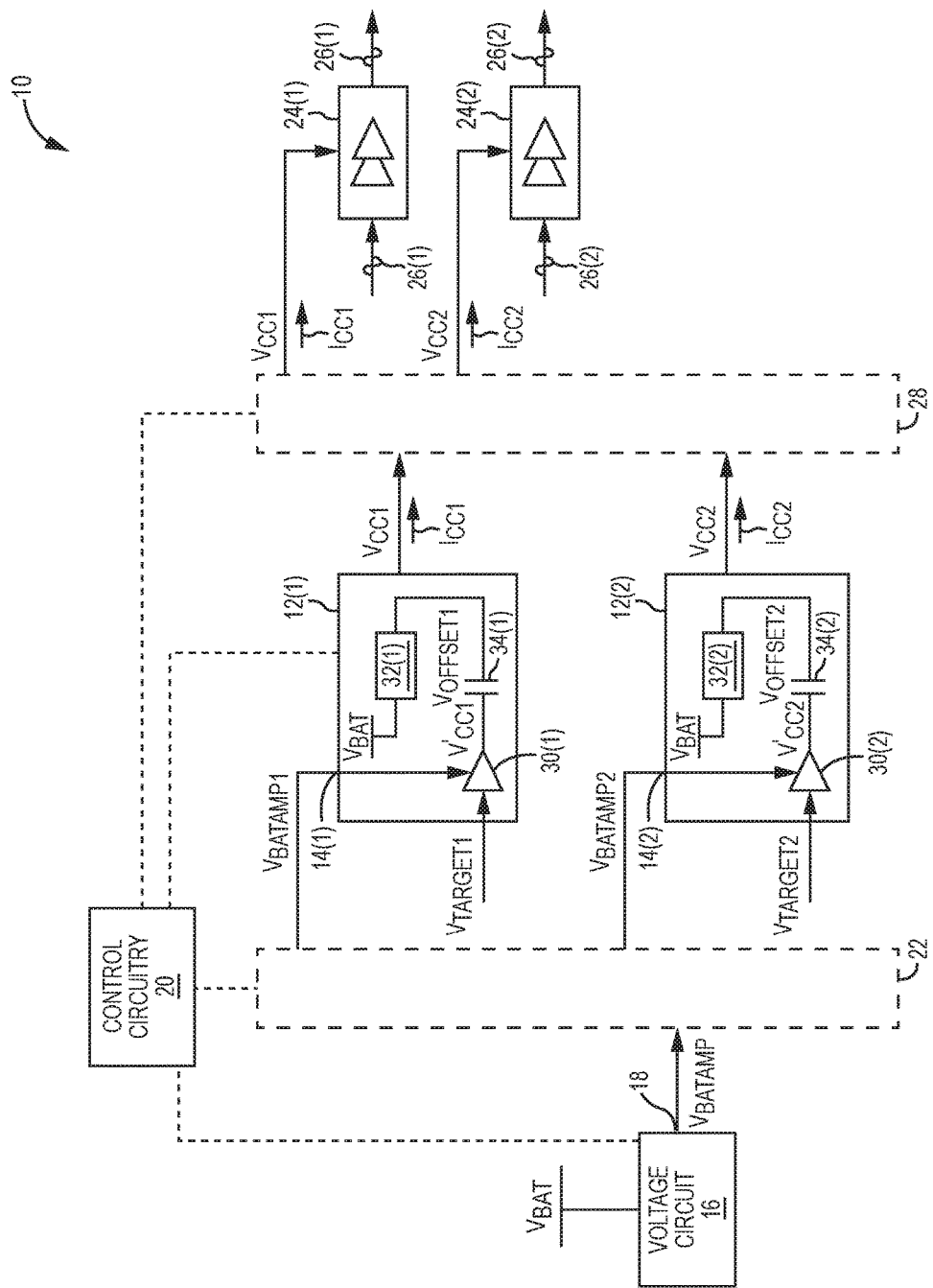
FIG. 2 is a schematic diagram providing an exemplary illustration of the ET power management circuit of FIG. 1 configured to support at least two selected amplifier circuits concurrently.

The ET power management circuit 10 can be configured to support various operation scenarios, which are discussed next with reference to FIGS. 2-4. In this regard, FIG. 2 is a schematic diagram providing an exemplary illustration of the ET power management circuit 10 of FIG. 1 configured to support at least two selected amplifier circuits concurrently. Common elements between FIGS. 1 and 2 are shown therein with common element numbers and will not be re-described herein.

In examples discussed herein, the amplifier circuits 24(1), 24(2) are referenced as the selected amplifier circuits. It should be appreciated that the selected amplifier circuits can be more than two of the amplifier circuits 24(1)-24(N). Similarly, the tracker circuits 12(1), 12(2) are referenced herein as at least two selected tracker circuits for the sake of illustration. It should also be appreciated that more than two of the tracker circuits 12(1)-12(M) can be designated as the selected tracker circuits by the control circuitry 20. Accordingly, the ET modulated voltages $V_{CC1}$, $V_{CC2}$ are referred to as at least two selected ET modulated voltages.

The selected tracker circuits 12(1), 12(2) include a pair of parallel amplifiers 30(1), 30(2) and a pair of charge pumps 32(1), 32(2), respectively. The parallel amplifiers 30(1), 30(2) are configured to generate a pair of ET voltages $V'_{CC1}$, $V'_{CC2}$ based on a pair of input voltages $V_{BATAMP1}$, $V_{BATAMP2}$, respectively. The selected tracker circuits 12(1), 12(2) include a pair of offset capacitors 34(1), 34(2). The offset capacitors 34(1), 34(2) are configured to raise the ET voltages $V'_{CC1}$, $V'_{CC2}$ by offset voltages $V_{OFFSET1}$, $V_{OFFSET2}$ to the ET modulated voltages $V_{CC1}$, $V_{CC2}$, respectively. In this regard, the selected ET modulated voltage $V_{CC1}$ equals a sum of the ET voltage $V'_{CC1}$ and the offset voltage $V_{OFFSET1}$ ($V_{CC1}=V'_{CC1}+V_{OFFSET1}$). Likewise, the selected ET modulated voltage $V_{CC2}$ equals a sum of the ET voltage $V'_{CC2}$ and the offset voltage $V_{OFFSET2}$ ($V_{CC2}=V'_{CC2}+V_{OFFSET2}$). In a non-limiting example, the offset voltages $V_{OFFSET1}$, $V_{OFFSET2}$ can each be approximately 800 mV.

The charge pumps 32(1), 32(2) are coupled to the batter voltage $V_{BAT}$ and configured to generate a pair of currents $I_{CC1}$ and $I_{CC2}$, respectively. Each of the currents $I_{CC1}$ and $I_{CC2}$ can be a combination of a direct current and an alternating current.

The control circuitry 20 controls the output voltage switching circuitry 28 to couple the selected tracker circuits 12(1), 12(2) to the selected amplifier circuits 24(1), 24(2), respectively. In this regard, the selected amplifier circuit 24(1) receives the selected ET modulated voltage $V_{CC1}$ and the current $I_{CC1}$ from the selected tracker circuit 12(1). Similarly, the selected amplifier circuit 24(2) receives the selected ET modulated voltage $V_{CC2}$ and the current $I_{CC2}$ from the selected tracker circuit 12(2).

The control circuitry 20 further controls the input voltage switching circuitry 22 to couple the voltage output 18 to the voltage inputs 14(1), 14(2). In this regard, the selected tracker circuit 12(1) receives the supply voltage $V_{BATAMP}$ as the input voltage $V_{BATAMP1}$ and the selected tracker circuit 12(2) receives the supply voltage $V_{BATAMP}$ as the input voltage $V_{BATAMP2}$.

Notably, the selected amplifier circuits 24(1), 24(2) may operate independently from each other. Accordingly, the selected tracker circuits may need to adapt the selected ET modulated voltages $V_{CC1}$ and $V_{CC2}$ to different levels. As a result, the selected tracker circuits 12(1), 12(2) may require the voltage circuit 16 to provide the input voltages $V_{BATAMP1}$, $V_{BATAMP2}$ at different levels as well. In this regard, in a non-limiting example, the control circuitry 20 can configure the voltage circuit 16 to generate the supply voltage $V_{BATAMP}$ based on a maximum input voltage between the input voltages $V_{BATAMP1}$, $V_{BATAMP2}$. More specifically, the voltage circuit 16 may be configured to generate the supply voltage $V_{BATAMP}$ based on the equation (Eq. 1) below.

$$V_{BATAMP} \approx \mathrm{MAX}(V_{BATAMP1}, V_{BATAMP2})$$

$$V_{BATAMP1} = V_{CC1\text{-}Peak} - (V_{OFFSET1} - P_{Headroom})$$

$$V_{OFFSET1} = V_{CC1\text{-}Bottom} - N_{Headroom}$$

$$V_{BATAMP2} = V_{CC2\text{-}Peak} - (V_{OFFSET2} - P_{Headroom})$$

$$V_{OFFSET2} = V_{CC2\text{-}Bottom} - N_{Headroom} \qquad \text{(Eq. 1)}$$

In the equation (Eq. 1) above, $V_{CC1\text{-}Peak}$ and $V_{CC1\text{-}Bottom}$ represent a maximum (peak) and a minimum (bottom) of the ET modulated voltage $V_{CC1}$. $V_{CC2\text{-}Peak}$ and $V_{CC2\text{-}Bottom}$ represent a maximum (peak) and a minimum (bottom) of the ET modulated voltage $V_{CC2}$. $P_{Headroom}$ and $N_{Headroom}$ represent ceiling and floor voltage headrooms associated with an output stage, which may be constructed based on a p-type and an n-type transistor, in the selected tracker circuits 12(1), 12(2).

Given that the voltage circuit 16 is configured to generate the supply voltage $V_{BATAMP}$ based on the maximum input voltage between the input voltages $V_{BATAMP1}$, $V_{BATAMP2}$, it may be necessary to configure the parallel amplifiers 30(1), 30(2) with proper supply voltage rejections to mitigate potential impact of input voltage swings. For example, the selected tracker circuit 12(1) may require the input voltage $V_{BATAMP1}$ to be provided at 3 V, while the selected tracker circuit 12(2) is requiring the input voltage $V_{BATAMP2}$ to be provided at 5 V. According to the equation (Eq. 1) above, the voltage circuit 16 would generate the supply voltage $V_{BATAMP}$ at 5V. In this regard, the parallel amplifier 30(1) in the selected tracker circuit 12(1) needs to be configured with appropriate supply voltage rejection such that the selected ET modulated voltage $V_{CC1}$ is not impacted by the increased input voltage.

Figure 3:
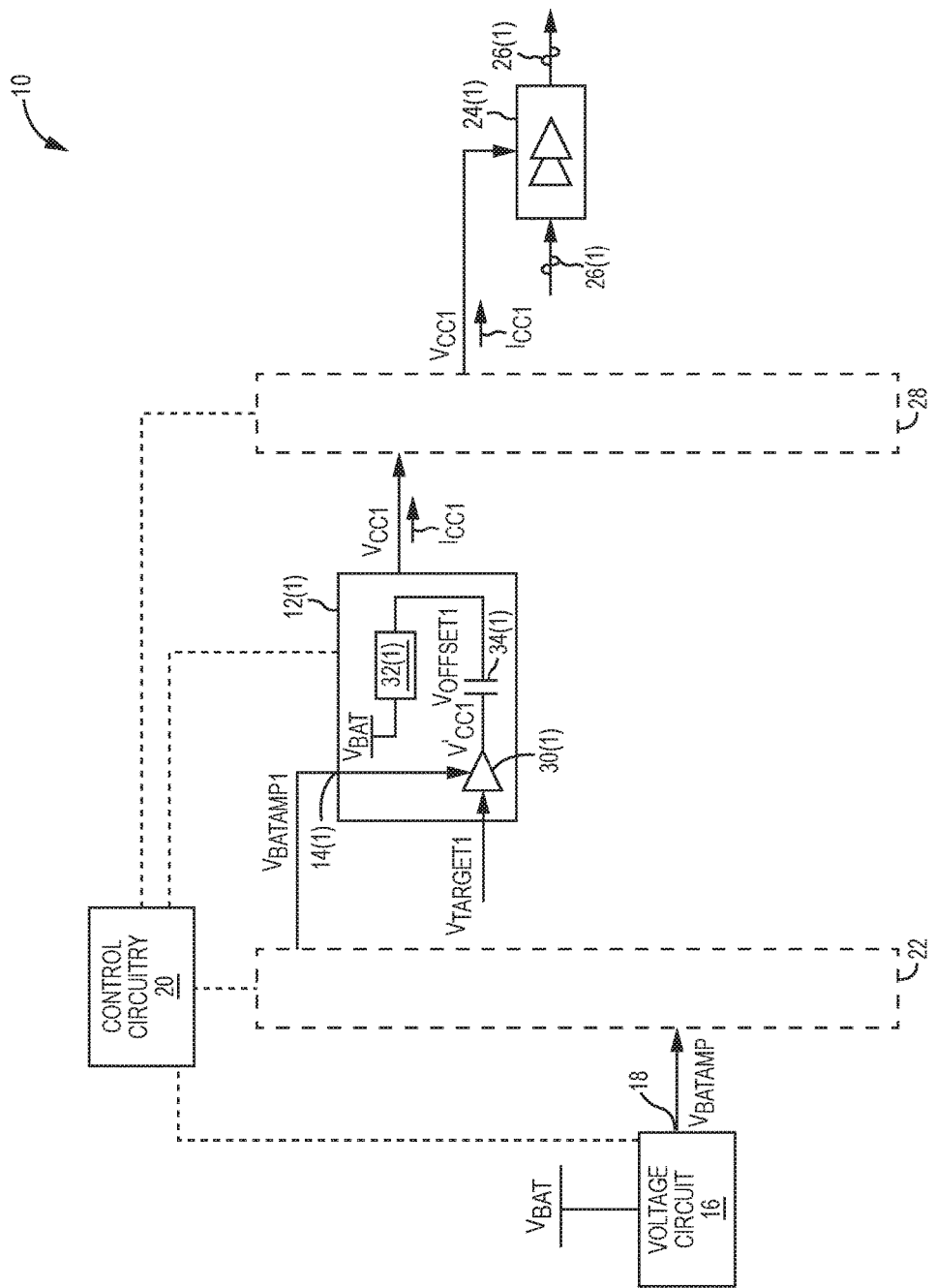
FIG. 3 is a schematic diagram providing an exemplary illustration of the ET power management circuit of FIG. 1 configured to support a single selected amplifier circuit.

FIG. 3 is a schematic diagram providing an exemplary illustration of the ET power management circuit 10 of FIG. 1 configured to support a single selected amplifier circuit. Common elements between FIGS. 1, 2, and 3 are shown therein with common element numbers and will not be re-described herein.

In examples discussed herein, the amplifier circuit 24(1) is referenced as the selected amplifier circuit. It should be appreciate that the selected amplifier circuits can be any of the amplifier circuits 24(1)-24(N). Similarly, the tracker circuit 12(1) is referenced herein as a selected tracker circuit for the sake of illustration. It should also be appreciated that any of the tracker circuits 12(1)-12(M) can be designated as the selected tracker circuit by the control circuitry 20. Accordingly, the ET modulated voltage $V_{CC1}$ is referred to as a selected ET modulated voltage.

In this regard, the control circuitry 20 controls the output voltage switching circuitry 28 such that the selected tracker circuit 12(1) can provide the selected ET modulated voltage $V_{CC1}$ and the current $I_{CC1}$ to the selected amplifier circuit 24(1). Accordingly, the selected amplifier circuit 24(1) amplifies the RF signal 26(1) to a power level corresponding to the selected ET modulated voltage $V_{CC1}$ and the current $I_{CC1}$. The control circuitry 20 also controls the input voltage switching circuitry 22 such that the voltage circuit 16 can provide the supply voltage $V_{BATAMP}$ to the selected tracker circuit 12(1) as the input voltage $V_{BATAMP1}$. The control circuitry 20 further configures the voltage circuit 16 to generate the supply voltage $V_{BATAMP}$ corresponding to the input voltage $V_{BATAMP1}$.

In a non-limiting example, the selected amplifier circuit 24(1) is required to amplify the RF signal 26(1) to a peak power greater than or equal to 33 dBm (approximately 2 Watts). In this regard, if a peak of the selected ET modulated voltage $V_{CC1}$ is maintained at a specific level (e.g., 5 V), the current loci would need to be increased to a significant level such that the selected amplifier circuit 24(1) can amplify the RF signal 26(1) to the desired peak power. However, to produce the current $I_{CC1}$ at the significantly increased level, the charge pump 32(1) may need to employ larger inductor(s), which can lead to increased footprint and heat dissipation in the selected tracker circuit 12(1).

Figure 4:
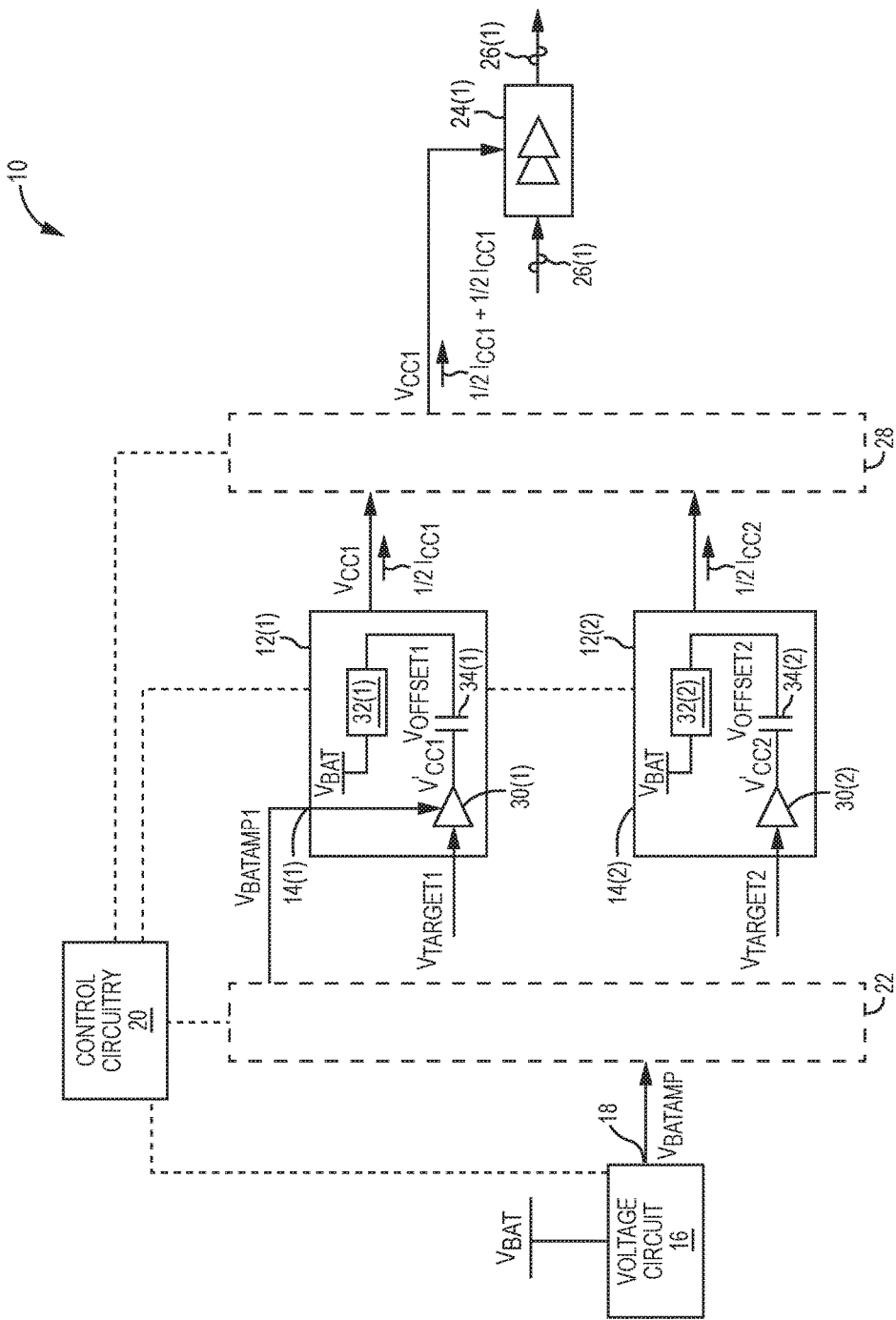
FIG. 4 is a schematic diagram providing an exemplary illustration of the ET power management circuit of FIG. 1 configured to support a single selected amplifier circuit in very high power (VHP) mode.

In this regard, FIG. 4 is a schematic diagram providing an exemplary illustration of the ET power management circuit 10 of FIG. 1 configured to support a single selected amplifier circuit in very high power (VHP) mode. Common elements between FIGS. 1, 2, 3, and 4 are shown therein with common element numbers and will not be re-described herein.

In examples discussed herein, the amplifier circuit 24(1) is referenced as the selected amplifier circuit. It should be appreciated that the selected amplifier circuits can be any of the amplifier circuits 24(1)-24(N). Similarly, the tracker circuit 12(1) is referenced herein as a selected tracker circuit for the sake of illustration. It should also be appreciated that any of the tracker circuits 12(1)-12(M) can be designated as the selected tracker circuit by the control circuitry 20.

The control circuitry 20 controls the output voltage switching circuitry 28 such that the selected tracker circuit 12(1) can provide the selected ET modulated voltage $V_{CC1}$ to the selected amplifier circuit 24(1). The control circuitry 20 also configures the charge pump 32(1) in the selected tracker circuit 12(1) to provide one-half of the current $I_{CC1}$ (½$I_{CC1}$) to the selected amplifier circuit 24(1). The control circuitry 20 further configures the charge pump 32(2) in a second selected tracker circuit 12(2) to provide one-half of the current $I_{CC2}$ (½$I_{CC2}$) to the selected amplifier circuit 24(1). Accordingly, the selected amplifier circuit 24(1) can amplify the RF signal 26(1) to a desired higher power level corresponding to the selected ET modulated voltage $V_{CC1}$ and a sum of (½$I_{CC1}$+½$I_{CC2}$). Given that the selected tracker circuit 12(1) alone is providing the ET modulated voltage $V_{CC1}$, the control circuitry 20 may deactivate the parallel amplifier 30(2) in the second selected tracker circuit 12(2) to help reduce power consumption and heat dissipation.

The control circuitry 20 also controls the input voltage switching circuitry 22 such that the voltage circuit 16 can provide the supply voltage $V_{BATAMP}$ to the selected tracker circuit 12(1) as the input voltage $V_{BATAMP1}$. The control circuitry 20 further configures the voltage circuit 16 to generate the supply voltage $V_{BATAMP}$ corresponding to the input voltage $V_{BATAMP1}$.

Those skilled in the art will recognize improvements and modifications to the preferred embodiments of the present disclosure. All such improvements and modifications are considered within the scope of the concepts disclosed herein and the claims that follow.

What is claimed is:

1. An envelope tracking (ET) power management circuit comprising:
   a voltage circuit comprising a voltage output and configured to generate a supply voltage at the voltage output;
   a plurality of tracker circuits comprising a plurality of voltage inputs configured to receive a plurality of input voltages, the plurality of tracker circuits configured to generate a plurality of ET modulated voltages based on the plurality of input voltages, respectively; and
   control circuitry configured to couple the voltage output to at least one selected voltage input among the plurality of voltage inputs to provide the supply voltage to at least one selected tracker circuit among the plurality of tracker circuits as a selected input voltage among the plurality of input voltages.

2. The ET power management circuit of claim 1 wherein the voltage circuit comprises an inductor-based buck-boost circuit configured to generate a constant voltage as the supply voltage at the voltage output.

3. The ET power management circuit of claim 1 further comprising a plurality of amplifier circuits.

4. The ET power management circuit of claim 3 wherein at least two selected amplifier circuits among the plurality of amplifier circuits are configured to amplify at least two radio frequency (RF) signals concurrently based on at least two selected ET modulated voltages among the plurality of ET modulated voltages.

5. The ET power management circuit of claim 4 wherein the control circuitry is further configured to configure at least two selected tracker circuits among the plurality of tracker circuits to generate the at least two selected ET modulated voltages based on at least two input voltages among the plurality of input voltages and provide the at least two selected ET modulated voltages to the at least two selected amplifier circuits, respectively.

6. The ET power management circuit of claim 5 wherein the control circuitry is further configured to couple the voltage output to at least two selected voltage inputs of the at least two selected tracker circuits to provide the supply voltage to the at least two selected tracker circuits as the at least two input voltages.

7. The ET power management circuit of claim 6 wherein the voltage circuit is further configured to generate the supply voltage based on a maximum input voltage among the at least two input voltages.

8. The ET power management circuit of claim 3 wherein a selected amplifier circuit among the plurality of amplifier circuits is configured to amplify a radio frequency (RF) signal based on a selected ET modulated voltage among the plurality of ET modulated voltages.

9. The ET power management circuit of claim 8 wherein the control circuitry is further configured to configure a selected tracker circuit among the plurality of tracker circuits to generate the selected ET modulated voltage based on an input voltage among the plurality of input voltages and provide the selected ET modulated voltage to the selected amplifier circuit.

10. The ET power management circuit of claim 9 wherein the control circuitry is further configured to couple the voltage output to a selected voltage input of the selected tracker circuit to provide the supply voltage to the selected tracker circuit as the input voltage.

11. The ET power management circuit of claim 10 wherein the voltage circuit is further configured to generate the supply voltage based on a maximum input voltage among the plurality of input voltages.

12. The ET power management circuit of claim 9 wherein the selected amplifier circuit is further configured to amplify the RF signal based on the selected ET modulated voltage and a current.

13. The ET power management circuit of claim 12 wherein the current comprises a direct current and an alternating current.

14. The ET power management circuit of claim 12 wherein the control circuitry is further configured to configure the selected tracker circuit to provide half of the current to the selected amplifier circuit.

15. The ET power management circuit of claim 14 wherein the control circuitry is further configured to configure a second selected tracker circuit different from the selected tracker circuit among the plurality of tracker circuits to generate and provide an other half of the current to the selected amplifier circuit.

16. The ET power management circuit of claim 15 wherein the control circuitry is further configured to configure the selected tracker circuit and the second selected tracker circuit to each generate the half of the current in response to determining that the selected amplifier circuit is required to amplify the RF signal to a power level of at least 33 dBm.

17. The ET power management circuit of claim 15 wherein each of the selected tracker circuit and the second selected tracker circuit includes a charge pump and a parallel amplifier.

18. The ET power management circuit of claim 17 wherein the charge pump and the parallel amplifier in the selected tracker circuit are configured to generate the half of the current and the selected ET modulated voltage, respectively.

19. The ET power management circuit of claim 17 wherein the charge pump in the second selected tracker circuit is configured to generate the other half of the current.

20. The ET power management circuit of claim 19 wherein the control circuitry is further configured to deactivate the parallel amplifier in the second selected tracker circuit.

21. The ET power management circuit of claim 3 wherein:
two selected amplifier circuits among the plurality of amplifier circuits are configured to amplify two radio frequency (RF) signals concurrently based on two selected ET modulated voltages among the plurality of ET modulated voltages;
the control circuitry is further configured to:
configure two selected tracker circuits among the plurality of tracker circuits to generate the two selected ET modulated voltages based on two input voltages among the plurality of input voltages and provide the two selected ET modulated voltages to the two selected amplifier circuits, respectively; and
couple the voltage output to two selected voltage inputs of the two selected tracker circuits to provide the supply voltage to the two selected tracker circuits as the two input voltages; and
the voltage circuit is further configured to generate the supply voltage based on a maximum input voltage among the two input voltages.

* * * * *

UNITED STATES PATENT AND TRADEMARK OFFICE
CERTIFICATE OF CORRECTION

PATENT NO. : 10,439,557 B2
APPLICATION NO. : 15/984566
DATED : October 8, 2019
INVENTOR(S) : Nadim Khlat and Michael R. Kay It is certified that error appears in the above-identified patent and that said Letters Patent is hereby corrected as shown below:

In the Specification

In Column 7, Line 27, replace "current loci" with --current $I_{CCI}$--.

Signed and Sealed this
Nineteenth Day of November, 2019

Andrei Iancu
*Director of the United States Patent and Trademark Office*